(12) United States Patent
Cheung

(10) Patent No.: US 7,675,328 B2
(45) Date of Patent: Mar. 9, 2010

(54) PHASE DETECTION APPARATUS AND PHASE SYNCHRONIZATION APPARATUS

(75) Inventor: Tszshing Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/320,494

(22) Filed: Jan. 27, 2009

(65) Prior Publication Data

US 2009/0140773 A1 Jun. 4, 2009

Related U.S. Application Data

(63) Continuation of application No. PCT/JP2006/314988, filed on Jul. 28, 2006.

(51) Int. Cl.
*H03D 13/00* (2006.01)

(52) U.S. Cl. .................. 327/3; 327/5; 327/7; 327/12; 327/156; 331/25

(58) Field of Classification Search ............... 327/2, 327/3, 5, 7–10, 12, 141, 144–150, 154, 155–159, 327/161–163; 331/25
See application file for complete search history.

(56) References Cited

U.S. PATENT DOCUMENTS

| 4,380,083 | A | * | 4/1983 | Andersson et al. | .......... 375/376 |
| 5,440,274 | A | * | 8/1995 | Bayer | .......... 331/1 A |
| 5,619,148 | A | | 4/1997 | Guo | |
| 5,789,947 | A | * | 8/1998 | Sato | .......... 327/3 |
| 5,917,352 | A | * | 6/1999 | Dunlap et al. | .......... 327/158 |
| 6,072,347 | A | * | 6/2000 | Sim | .......... 327/276 |
| 6,087,857 | A | * | 7/2000 | Wang | .......... 327/5 |
| 6,756,808 | B2 | * | 6/2004 | Furuya | .......... 326/9 |

FOREIGN PATENT DOCUMENTS

| EP | 0 613 253 | 8/1994 |
| EP | 0613253 A1 | 8/1994 |
| JP | 9-223960 | 8/1997 |

OTHER PUBLICATIONS

International Preliminary Report on Patentability dated Feb. 9, 2009 in corresponding PCT Application PCT/JP2006/314988 (11 pp including translation).
International Search Report (International Application No. PCT/JP2006/314988; International Search Report Mailing Date: Oct. 24, 2006).

* cited by examiner

*Primary Examiner*—Lincoln Donovan
*Assistant Examiner*—Patrick O'Neill
(74) *Attorney, Agent, or Firm*—Staas & Halsey LLP

(57) ABSTRACT

A feedback circuit includes a third variable delay device that controls the amount of phase delay of a first clock; a third logic gate that detects a phase difference between the first clock delayed by the third variable delay device and the first clock, and outputs a third signal of a pulse width corresponding to the phase difference detected; and a LPF that outputs, as a control signal Vcontrol, the integral of the pulse width of the third signal. The control signal Vcontrol, indicative of a delay amount, is fed back the third variable delay device and input to a first variable delay device and a second variable delay device of a phase-difference detection unit.

10 Claims, 10 Drawing Sheets

US 7,675,328 B2

PHASE DETECTION APPARATUS AND PHASE SYNCHRONIZATION APPARATUS

This application is a continuing application, filed under 35 U.S.C. §111(a), of International Application No. PCT/JP2006/314988, filed Jul. 28, 2006, the disclosure of which is hereby incorporated by reference.

BACKGROUND

1. Field

The present invention pertains to a phase detection apparatus and a phase synchronization apparatus applicable to transmission apparatuses using a high-speed clock and clock generators.

2. Description of the Related Art

Conventional phase synchronization apparatuses that detect and synchronize phases include a phase lock loop frequency synthesizer. Phase synchronization apparatuses are applied to transmission apparatuses for example and generate a given frequency. FIG. 14 is a circuit diagram of a conventional transmission apparatus. A transmission apparatus 1000 depicted in FIG. 14 has a configuration of a transmission circuit of an optical transmission apparatus using optical fibers. A signal from a serializer/deserializer (SERDES) 1001 is transmitted as an optical signal from a light receiving element 1003 such as a laser diode (LD) driven by a driver (DRV) 1002. The SERDES 1001 includes a multiplexer (MUX) 1004 and a flip flop (FF) 1005. The SERDES 1001 is connected to a clock multiplication unit (CMU) 1010 and a 1/n-frequency divider (frequency divider) 1011.

The CMU 1010 is widely used in, for example, transmission circuits and clock generators of transmission apparatuses and outputs a clock signal Ck(f) to the FF 1005 of the SERDES 1001 and the frequency divider 1011. The frequency divider 1011A outputs a clock signal Ck(f/n) to the CMU 1010 as feedback and further outputs the clock signal Ck(f/n) to the MUX 1004 of the SERDES 1001.

The symbol "f" denotes a frequency of a high-speed clock and "n" is an integer. A symbol "fr" denotes a reference clock supplied from an external source (a crystal oscillator or a stable system-clock). The CMU 1010 is used to synchronize the reference clock fr with the output of the transmission apparatus. The symbol Ck(f/n) is a clock signal (Ck(f/n)=fp) whose frequency f is divided by n. A frequency of the clock signal Ck(f) output from the CMU 1010 is a high-frequency clock with a rate n times fr, thereby enabling faster data transmission rates.

FIG. 15 is a circuit diagram of an internal structure of the CMU depicted in FIG. 14. The CMU 1010 includes a phase detector (PD) 1101, a charge pump (CP) 1102, a low pass filter (LPF) 1103, and a voltage control oscillator (VCO) 1104.

The PD 1101 is an important constituent of the CMU 1010 and the characteristics of the PD 1101 influence the accuracy and quality of a clock signal. Accuracy requires phase errors to be minimized while quality requires jitter and noise to be minimized. The operating frequency of a multiplexer (MUX) employing the CMU 1010 has improved, reaching 10 GHz, 20 GHz, 30 GHz, and above.

Output signals up and dn output from the PD 1101 are input to the CP 1102. The CP 1102 outputs a voltage V_CP, and the LPF 1103 outputs a voltage V_LPF. For example, when Ck(f/n) is faster than fr, the PD 1101 generates and outputs the output signal dn (continual pulse signal) to the CP 1102. The voltage V_CP output from the CP 1102 and the voltage V_LPF output from the LPF 1103 gradually change together until V_LPF reaches a constant voltage (value).

It is known that the maximum usable (operating) frequency of an element such as a logic gate used in the PD 1101 is limited. Particularly, when CMOS and BiCMOS are used, higher operating frequencies (for example, a transmission apparatus with 40 Gbps) for faster data transmission have not yet been achieved. Conventionally, the PD 1101 does not operate fast enough, one reason of which is a dead zone of the PD 1101.

FIG. 16 is a circuit diagram depicting an example of a conventional phase detecting unit. The PD 1101 depicted in FIG. 16 uses two delay elements 1, 2 (1201, 1202) that induce a given delay. The dead zone is invoked by an "insensitive" area of logic gates 1 and 2 (1211, 1212) that detect a difference between clocks fr and fp. The clocks fr and fp are input signals that are phase-delayed by and output from the delay elements 1 and 2 (1201, 1202) as signals fr2 and fp2. In this way, the logic gates 1 and 2 (1211, 1212) operate preventing the dead zone.

Japanese Patent Application Laid-Open Publication No. H9-223960 discloses that a PD includes multiple delay elements, multiple phase comparators, and an adder to prevent the dead zone.

The dead zone of the PD 1101 is defined as a state in which the PD 1101 cannot distinguish phase differences between the clocks fr and fp. The dead zone does not change the signals up and dn output from the PD 1101 even if there is a change in phase between the clocks fr and Ck(f/n). The CMU 1010 continues to operate with a certain operating frequency even if the clock Ck(f/n) is not equal to the frequency of the clock fr. The VCO 1104 outputs a certain natural frequency (free running frequency) even without any input. In this case, a frequency error (frequency mismatch) occurs in the frequencies of the clocks Ck(f) and Ck(f/n), thereby causing a phase error of clock signals. Such phase errors gradually accumulate until the PD 1101 can detect the phase difference between the clocks fr and Ck(f/n). When the output signal up or dn appears again, ripples (fluctuation) occur in V_LPF.

Even if the dead zone is eliminated using a pair of delay elements, there is still a problem of mismatch of transistors or switches. When a bipolar transistor is used for the CP 1102 of FIG. 16, a mismatch occurs due to the differing properties of a pair of transistors: the p-n-p transistor 1221 and the n-p-n transistor 1222. The p-n-p transistor 1221 and the n-p-n transistor 1222 do not have identical properties. As a constant current source, a pair of transistors 1231 and 1232 is used. When a CMOS is used for the CP 1102, a mismatch occurs due to the differing properties of the paired nMOSFET and PMOSFET.

FIG. 17 is a timing chart depicting operation of a conventional phase-detecting unit. The output signals up and dn depicted in FIG. 16 are output during any of the following states:

(1) a period in which the clock fr is earlier than the clock fp (early);
(2) a period in which the clock fr is slightly earlier than the clock fp (Lock+error);
(3) a period in which the clock fr and the clock fp are in a synchronized (locked) state (Lock).

The relative timing of signals is similar when the clock fr is later than the clock fp; hence, for brevity explanation is omitted herein.

As FIG. 17 depicts, conventionally the PD 1101 continuously outputs, regardless of the period, the output signals up and dn, the output signals up and dn overlapping each other. Consequently, ripples occur in the voltage (V_LPF) output from the LPF 1103 during the period of the locked state (3) due to the mismatch of transistors. It is difficult to remove the ripples completely, limiting a gain bandwidth of the LPF 1103. The ripples eventually appear in the clock Ck(f) output from the VCO 1104 as jitter (see FIG. 15). Jitter lowers communication quality (for example, bit error rate (BER)) of a MUX or a transmission apparatus, or limits the maximum operating frequency of the CMU 1010.

The conventional PD 1102 cannot resolve the problem of propagation delay of the logic gates 1 and 2 (1211, 1212), thereby limiting the frequency of the input clocks fr and fp, and limiting the operating frequency to a relatively low value.

SUMMARY

It is an object of the present invention to at least solve the above problems in the conventional technologies.

A phase detection apparatus according to one aspect of the present invention includes a phase-difference detection unit that includes a first variable delay device that delays a phase of a first clock by a variable amount, a first logic gate that detects a phase difference between the first clock delayed by the first variable delay device and a second clock, and outputs a first signal of a pulse width corresponding to the phase difference detected, a second variable delay device that delays a phase of the second clock by a variable amount, and a second logic gate that detects a phase difference between the second clock delayed by the second variable delay device and the first clock, and outputs a second signal of a pulse width corresponding to the phase difference detected. The phase detection apparatus further includes a feedback circuit that includes a third variable delay device that delays the phase of the first clock by a variable amount, a third logic gate that detects a phase difference between the first clock delayed by the third variable delay device and the first clock, and outputs a third signal of a pulse width corresponding to the phase difference detected, and a smoothing unit that outputs an integral of the pulse width of the third signal as a control signal indicative of an amount of delay. The control signal is fed back to the third variable delay device and input to the first and the second variable delay devices. The feedback circuit is arranged independent of the phase-difference detection unit.

A phase synchronization apparatus according to another aspect of the present invention includes a phase-difference detection unit that includes a first variable delay device that delays a phase of a first clock by a variable amount, a first logic gate that detects a phase difference between the first clock delayed by the first variable delay device and a second clock, and outputs a first signal of a pulse width corresponding to the phase difference detected, a second variable delay device that delays a phase of the second clock by a variable amount, and a second logic gate that detects a phase difference between the second clock delayed by the second variable delay device and the first clock, and outputs a second signal of a pulse width corresponding to the phase difference detected. The phase synchronization apparatus further includes a feedback circuit that includes a third variable delay device that delays the phase of the first clock by a variable amount, a third logic gate that detects a phase difference between the first clock delayed by the third variable delay device and the first clock, and outputs a third signal of a pulse width corresponding to the phase difference detected, and a first smoothing unit that outputs an integral of the pulse width of the third signal as a control signal indicative of an amount of delay. The control signal is fed back to the third variable delay device and input to the first and the second variable delay devices. The phase synchronization apparatus further includes a charge pump that outputs a signal of a value corresponding to the first signal and the second signal; a second smoothing unit that outputs a signal of a value obtained by smoothing the signal from the charge pump; and an oscillator that changes an oscillating frequency based on the signal from the second smoothing unit and outputs the first clock. The feedback circuit is arranged independent of the phase-difference detection unit.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

With reference to the accompanying drawings, exemplary embodiments according to the present invention are explained. The phase detection apparatus has a configuration different from the conventional PD 1101 depicted in FIGS. 14 and 15.

Figure 1:
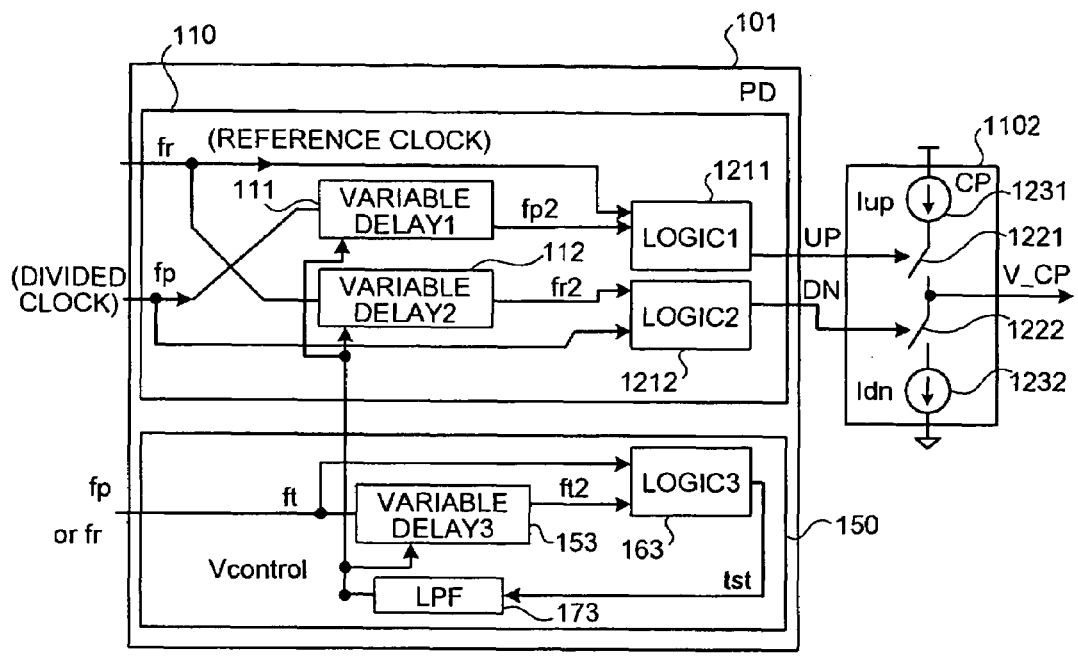
FIG. 1 is a circuit diagram depicting a phase detection apparatus according to an embodiment of the present invention.
Figure 15:
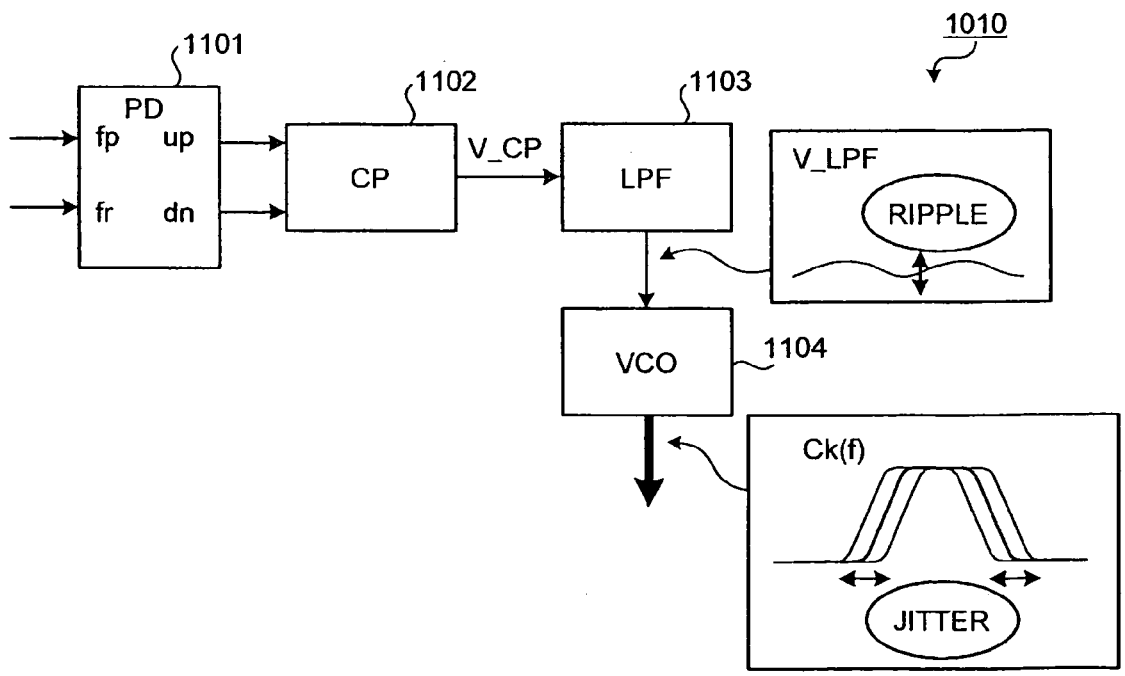
FIG. 15 is a circuit diagram of an internal structure of the CMU depicted in FIG. 14.
Figure 16:
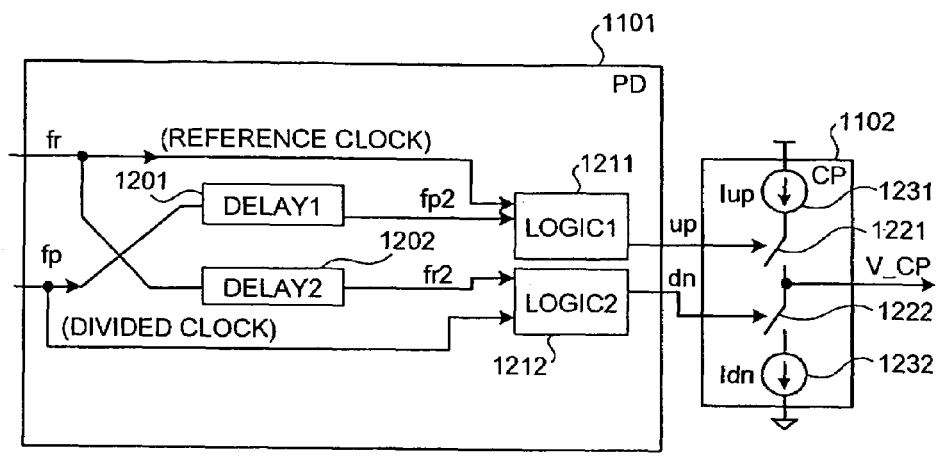
FIG. 16 is a circuit diagram depicting an example of a conventional phase detecting unit.

FIG. 1 is a circuit diagram depicting a phase detection apparatus according to an embodiment of the present invention. The configuration depicted in FIG. 1 is to be incorporated into the CMU 1010 depicted in FIG. 15. Components identical to those depicted in FIG. 16 are given identical reference numerals.

The phase detection unit (PD) 101 includes a phase-difference detection unit 110 and a feedback circuit 150 connected to the phase-difference detection unit 110. The signals up and dn are output to a charge pump (CP) 1102. The CP 1102 has a configuration identical to that depicted in FIG. 16. The CP 1102 outputs a voltage V_CP to a low pass filter (LPF) 1103, which is a smoothing unit smoothing an input signal. The LPF 1103 outputs a voltage V_LPF to an oscillating unit (VCO) 1104 that outputs a clock Ck(f). Signals fr, fp and ft are clock signals (hereinafter, the clock signals are called clock or signal for brevity).

As depicted, the phase-difference detection unit 110 includes delay elements, which are variable delay devices 1 and 2 (111, 112) controlling an amount of delay. The phase-difference detection unit 110 receives the clocks fr and fp, detects a phase difference between the clocks fr and fp, and outputs to the CP 1102, the output signals up and dn of a certain period corresponding to the phase difference.

A reference clock fr is split and input into a first logic gate (logic gate 1) 1211 and a second variable delay device (variable delay device 2) 112. The reference clock fr is delayed by the variable delay device 2 (112) and output as a clock fr2 to a second logic gate (logic gate 2) 1212. A divided clock fp is split and input into the logic gate 2 (1212) and a first variable delay device (variable delay device 1) 111. The divided clock fp is delayed by the variable delay device 1 (111) and output as clock fp2 to the logic gate 1 (1211).

The logic gate 1 (1211) outputs the output signal up based on the phase difference between the clocks fr and fp2. The logic gate 2 (1212) outputs the output signal dn based on the phase difference between the clocks fp and fr2.

The feedback circuit 150 selectively receives either of the clocks fp or fr. When the free running frequency of the VCO 1104 (see FIG. 15) is substantially equal to n times fr (n: a rate of frequency division of the frequency divider 1011), either of the clocks fp or fr can be used selectively as a clock ft input to the feedback circuit 150. When the free running frequency is not guaranteed, the clock fp is used as the clock ft.

The clock (clock fr or fp) input to the feedback circuit 150 is split and input to a third logic gate (logic gate 3) 163 and a third variable delay device (variable delay device 3) 153. The clock input to the variable delay device 3 (153) is delayed and output as a clock ft2 to the logic gate 3 (163). The logic gate 3 (163) outputs to an LPF 173, a signal tst corresponding to a phase difference between the clocks ft and ft2. The LPF 173 acts as a smoothing unit that smoothes signals input thereto. Specifically, the LPF 173 outputs, as a control signal Vcontrol, a value of the integral of the signal tst. The Vcontrol is output to the variable delay devices 1, 2, 3 (111, 112, 153) as control signals of the same value.

As described above, in the feedback circuit 150, a feedback path (negative feedback) (input fp (fr)→variable delay device 3 (153)→logic gate 3 (163)→LPF 173→variable delay device 3 (153)) is formed.

The two variable delay devices 1, 2 (111, 112) of the phase-difference detection unit 110 of the PD 101 and the variable delay device 3 (153) of the feedback circuit 150 are identical. These three variable delay devices 1, 2, 3 (111, 112, 153) induce a larger delay the smaller the value of the control signal Vcontrol becomes (as the value of the control signal Vcontrol increases, a delay decreases). Based on the control signal Vcontrol, the delay of the three variable delay devices 1, 2, 3 (111, 112, 153) is controlled to be optimal. The two logic gates 1, 2 (1211, 1212) of the phase-difference detection unit 110 and the logic gate 3 (163) of the feedback circuit 150 are identical.

Figure 2:
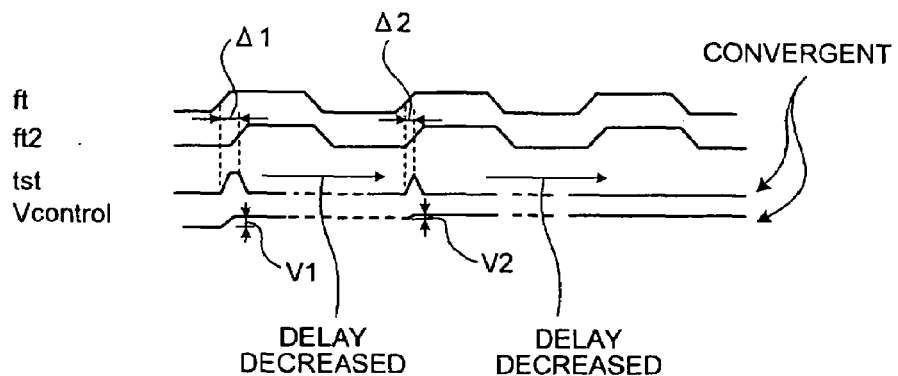
FIG. 2 is a timing chart depicting an operation of a feedback circuit of the phase detection apparatus.

FIG. 2 is a timing chart depicting an operation of the feedback circuit of the phase detection apparatus. FIG. 2 depicts timing during the "lock-in" period of the CMU 1010. The clock ft input to the feedback circuit 150 is delayed by a given amount Δ (Δ=ft−ft2) by the variable delay device 3 (153). The logic gate 3 (163) outputs a pulse signal tst having a pulse width corresponding to the delay Δ. The LPF 173 outputs the control signal Vcontrol of a value (voltage) of the integral of the pulse signal tst.

The feedback circuit 150 resets an initial value of the control signal Vcontrol to zero. The pulse width of the pulse signal tst from the logic gate 3 (163) is relatively large. In other words, at the initiation of operation, the delay Δ1 and the phase difference ft−ft2 between the clocks ft and ft2 corresponding to the delay Δ1 are large. when the PD 101 begins to operate, the initial value of the control signal Vcontrol is set to a low voltage and the phase difference ft−ft2 is relatively large. The pulse signal tst from the logic gate 3 (163) is integrated by the LFP 173 and output as the control signal Vcontrol. The control signal Vcontrol outputs a value $V_1$ according to the pulse width of the pulse signal tst of the delay Δ1 and increases the value by V2 according to the pulse width of the pulse signal tst of an altered delay Δ2.

Since the feedback circuit 150 forms such negative feedback, the phase difference ft-ft2 corresponding to the delay Δ eventually reaches a minimum (minphase (ft, ft2)). The delay Δ of the variable delay device 3 (153) gradually decreases (Δ1−Δ2) and the pulse width of the pulse signal also decreases. In the end, the delay Δ becomes zero (Δ=ft−ft2=0) and the pulse width of the pulse signal becomes zero, whereby the pulse signal is no longer generated. The value of the control signal Vcontrol converges to a given value.

The control signal Vcontrol is also output to the two variable delay devices 1, 2 (111, 112) in the phase-difference detection unit 110 and thus the delay of the variable delay devices 1, 2, 3 (111, 112, 153) are identical. As a result, the delay detected at the logic gate 3 (163) is substantially equal to the delay detected at the logic gates 1, 2 (1211, 1212) that are in the phase-difference detection unit 110 and output the output signals up, dn. According to the feedback operation of the feedback circuit 150, the phase difference converges to the minimum (minphase (ft, ft2)).

As described above, while the logic gate 3 (163) operates as a "feedback" circuit to adjust the delay of the variable delay device 3 (153), the logic gates 1, 2 (1211, 1212) of the phase-difference detection unit 110 operate without being affected by the dead zone and generate appropriate output signals up and dn.

Figure 3:
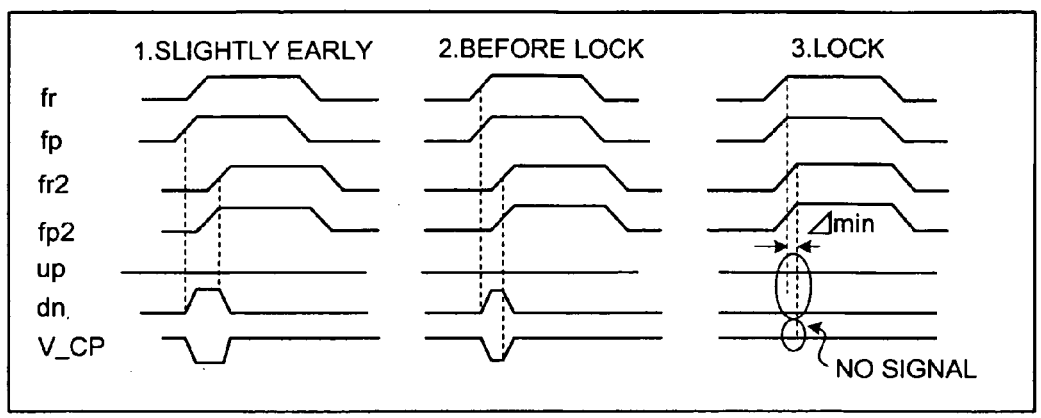
FIG. 3 is a timing chart depicting a state of each signal of the phase-difference detection unit near a locked state.

FIG. 3 is a timing chart depicting a state of each signal of the phase-difference detection unit near a locked state. From the left, the charts are (1) a state where the phase difference of the input clocks fr and fp is slight (slightly early), (2) a state immediately before a locked state (before lock), and (3) a locked state (lock). Preceding the states depicted in FIG. 3, there is a state in which the phase difference between the input clocks fr and fp is relatively large (not depicted) and in this state, the voltage V_CP output from the CP 1102 reflects the output signals up and dn of a pulse width corresponding to the phase difference of the input clocks fr and fp. Subsequent to this state, the state (1) of the FIG. 3 occurs.

In the state (1), the phase difference between the clocks fr and fp is increased by the variable delay devices 111, 112 and input to the logic gates 1, 2 (1211, 1212). In response, the logic gates 1, 2 (1211, 1212) output signals up and dn of a wide pulse width. In the states depicted in FIG. 3, since fp is faster than fr, the output signal dn is generated to reduce the frequency of VCO 1104 (see FIG. 15). In the voltage V_CP output from the CP 1102, ripples corresponding to a pulse width of the signals up and dn occur.

Even in the state (2), although the phase difference (fp, fr) is small, the phase-difference detection unit 110 of the PD 101 can generate output signals up and dn having an appropriate pulse width to correct a phase error between the clocks fr and fp. At the same time, all the variable delay devices 1, 2, 3 (111, 112, 153) are controlled by the feedback circuit 150 to induce a proper amount of delay, thereby reducing ripples in the output V_CP of the CP 1102.

In the locked state (3), the phase difference (fp, fr) vanishes eventually and the phase-difference detection unit 110 does not output the output signals dn or up. As a result, ripples do not occur in the voltage V_CP output by the CP 1102. At this moment, the voltage V_CP output from the CP 1102 is stabilized. During the locked state (3), neither dead zones nor ripples occur; whereby jitter of the VCO 1104 can be removed.

As explained above, the variable delay devices 1, 2 (111, 112) are used for the phase-difference detection unit 110 of the PD 101, and the amount of delay is controlled by the feedback circuit 150 so as to decrease gradually. In this way, the phase-difference detection unit 110 can output accurate output signals up and dn to the CP 1102 until the locked state and during the locked state.

The phase-difference detection unit 110 includes variable delay devices and logic gates similar to those in the feedback circuit 150. The feedback circuit 150 controls the amount of delay induced by the variable delay devices 1, 2 (111, 112) of the phase-difference detection unit 110 so that the delay time is always proper. Consequently, dead zones of the logic gates 1, 2 (1211, 1212) can be eliminated (dead zones can be prevented). At the same time, the output signals up and dn stabilize the voltage V_CP output from the CP 1102 by the properly controlled delay amount, thereby preventing the occurrence of unnecessary ripples. As the CP 1102 outputs stabilized voltage V_CP, the voltage V_LPF output from the LPF 1103 is stabilized and jitter in the output from the VCO 1104 to which the voltage V_LPF is input is prevented.

In the PD 101, the phase-difference detection unit 110 and the feedback circuit 150 use identical variable delay devices 1, 2, 3 (111, 112, 153) and identical logic gates 1, 2, 3 (1211, 1212, 163). As a result, the PD 101 is not affected by temperature fluctuations or fabrication process variations among the devices.

The impact of temperature changes on the characteristics is explained. Suppose that the room temperature changed by delta(T). In response, in the feedback circuit 150:

$$\text{phase}(ft, ft2) = \text{phase\_o}(ft, ft2) + kt.\text{delta}(T) \quad (1)$$

where, phase_o(ft, ft2) denotes the phase difference between ft and ft2 at the room temperature, and kt denotes a temperature coefficient of the variable delay device 153.

In response to the temperature change, for the output signal up of the phase-difference detection unit 110:

$$\text{phase}(fr, fp2) = \text{phase\_o}(fr, fp2) + kt.\text{delta}(T) \quad (2)$$

where, phase_o(fr, fp2) denotes the phase difference between the clocks fr and fp2 at the room temperature.

From equations (1) and (2), equation (3) is deduced.

$$\begin{aligned}&\text{difference between phase}(ft, ft2) \text{ and phase}(fr, fp2)\\&= \text{difference between phase\_o}(ft, ft2) \text{ and phase\_}\\&\quad o(fr, fp2)\end{aligned} \quad (3)$$

According to equation (3), the control by the feedback circuit 150 of the PD 101 is not affected by temperature changes.

Another factor causing characteristics change is variation of device characteristics during the LSI fabrication process for the PD 101. This factor can be eliminated by fulfilling the following conditions:

(1) All devices forming the three variable delay devices 1, 2, 3 (111, 112, 153) are located within a given range on the surface of an integrated circuit (IC).

(2) All devices forming the three logic gates 1, 2, 3 (1211, 1212, 163) are located within a given range on the surface of the IC.

(3) Devices arranged according to (1) and (2) receive a sufficiently small influence from fabrication process variation. For example, when a distance between devices is less than 10 μm in the fabrication process of a standard CMOS, the characteristics change is less than 1%. The PD 101 is not affected by the temperature changes above and has a configuration that resolves the issue of fabrication process variation.

Figure 4:
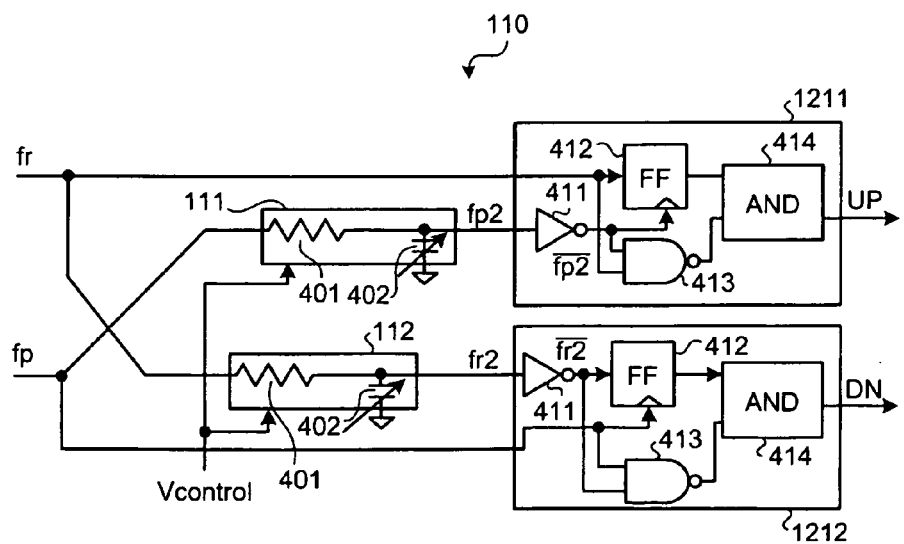
FIG. 4 is a circuit diagram of an example of the phase-difference detection unit.

FIG. 4 is a circuit diagram of an example of the phase-difference detection unit. The variable delay devices 111 and 112 include a resistor 401 and a variable capacitor 402 to form a CR circuit. The capacitance of the variable capacitor 402 is controlled by the control signal Vcontrol to change the amount of delay. The logic gate 1 (1211) includes an inverter 411 that outputs the clock fp2 inverted, a FF 412 that receives the clock fr at a data terminal and receives the inverted clock fp2 at a clock terminal, a NAND circuit 413 that outputs a value of the negation of logical conjunction (NAND) operation of the clock fr and the inverted clock fp2, and an AND circuit 414 that outputs, as an output signal up, a value of the logical conjunction (AND) operation of the value output from the FF 412 and the value output from the NAND circuit 413. The logic gate 2 (1212) has a configuration that is identical to the logic gate 1 (1211), receives the clocks fp and fr2, and outputs an output signal dn. The phase-difference detection unit 110 outputs output signals up and dn corresponding to the phase difference between the clocks fr and fp.

Figure 5:
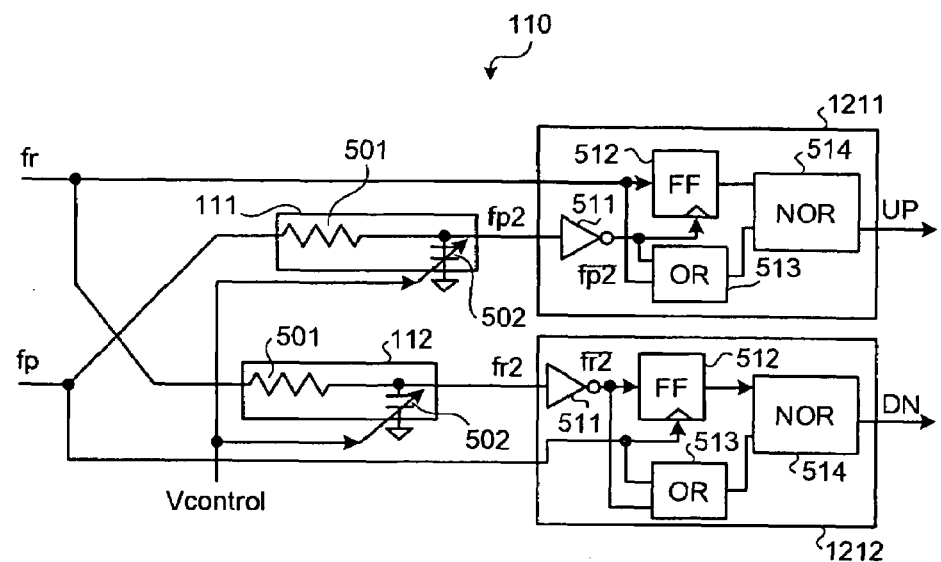
FIG. 5 is a circuit diagram of another example of the phase-difference detection unit.

FIG. 5 is a circuit diagram of another example of the phase-difference detection unit. The variable delay devices 111 and 112 include a resistor 501 and a variable capacitor 502 to form a CR circuit. The capacitance of the variable condenser 502 is controlled by the control signal Vcontrol to change the amount of delay. The logic gate 1 (1211) includes an inverter 511 that outputs the clock fp2 inverted, a FF 512 that receives the clock fr at a data terminal and receives the inverted clock fp2 at a clock terminal, an OR circuit 513 that outputs a value of the logical disjunction (OR) operation of the clock fr and the inverted clock fp2, a NOR circuit 514 that outputs, as an output signal up, a value of the negation of logical disjunction (NOR) operation of the value output from the FF 512 and the value output from the OR circuit 513. The logic gate 2 (1212) has a configuration that is identical to the logic gate 1 (1211), receives fp and fr2, and outputs the output signal dn. The phase-difference detection unit 110 outputs output signals up and dn corresponding to the phase difference between the clocks fr and fp. The variable delay devices 111 and 112 are not limited to the combination of a resistor of a fixed resistance and a variable capacitor having a variable capacitance. The variable delay devices 111 and 112 may include a combination of a variable resistor having a variable resistance and a capacitor of a fixed capacitance.

Figure 6:
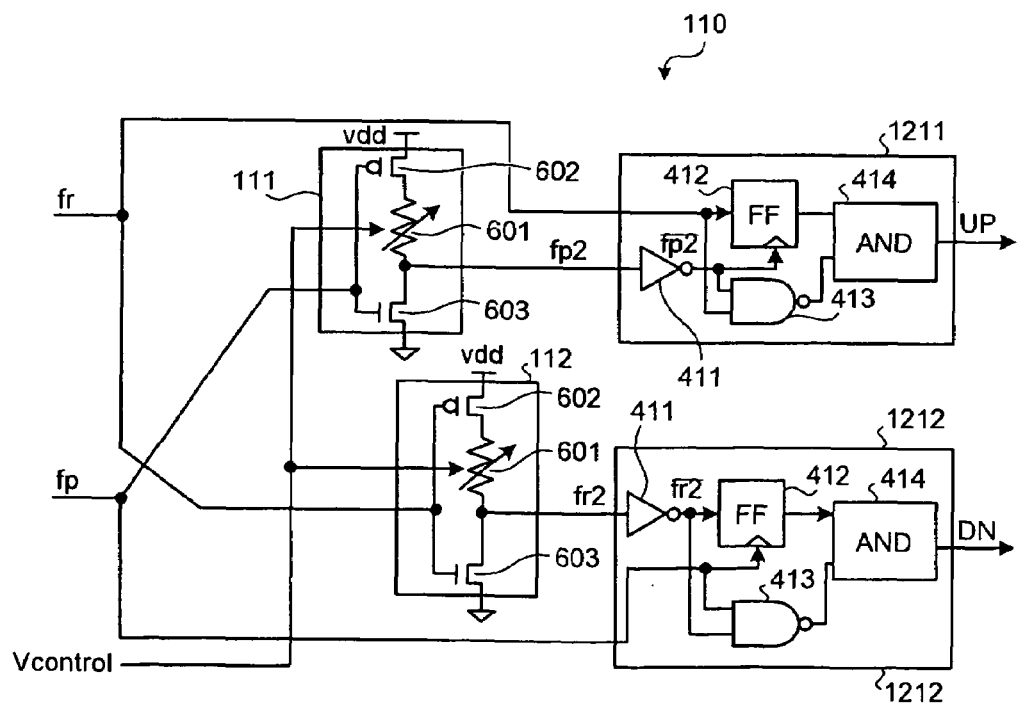
FIG. 6 is a circuit diagram of another example of the phase-difference detection unit.

FIG. 6 is a circuit diagram of another example of the phase-difference detection unit. The variable delay devices 111 and 112 each include a variable resistor 601 and two transistors 602 and 603. The transistor 602 is a p-type MOSFET and the transistor 603 is an n-type MOSFET. Supply voltage Vdd is applied to a source terminal of the p-type MOSFET 602 and a drain terminal of the p-type MOSFET 602 is connected to one end of the variable resistor 601. A source terminal of the n-type MOSFET 603 is connected to the other end of the resistor 601 and the drain terminal is grounded. Gate terminals of the transistors 602 and 603 of the variable delay device 111 receive the clock fp, and gate terminals of the transistors 602 and 603 of the variable delay device 112 receive the clock fr. The resistance of the variable resistor 601 is controlled by the control signal Vcontrol to change the amount of delay. The logic gates 1 and 2 (1211 and 1212) have a configuration identical to the logic gates depicted in FIG. 4.

Figure 7:
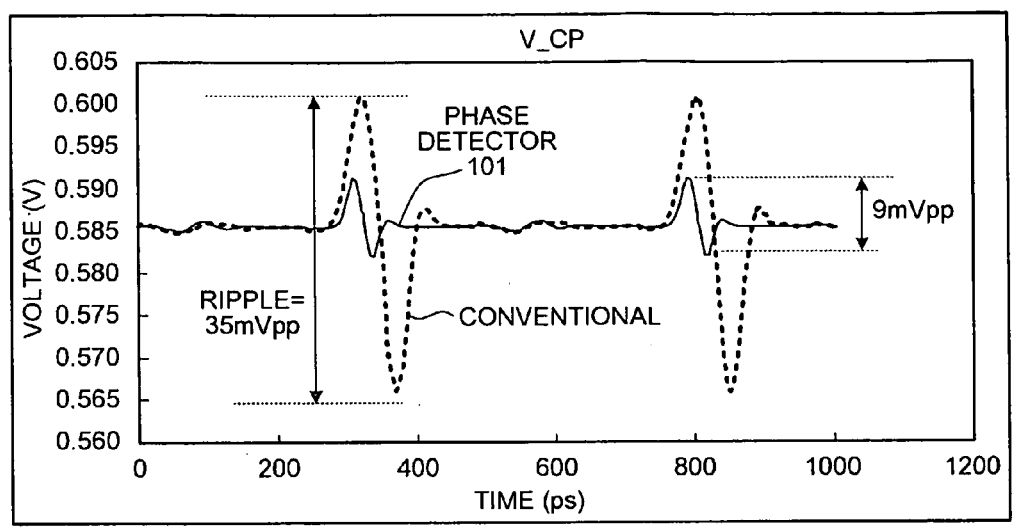
FIG. 7 is a timing diagram depicting a simulation result immediately before the locked state of a CMU adopting the phase detection apparatus according to the exemplary embodiments.
Figure 8:
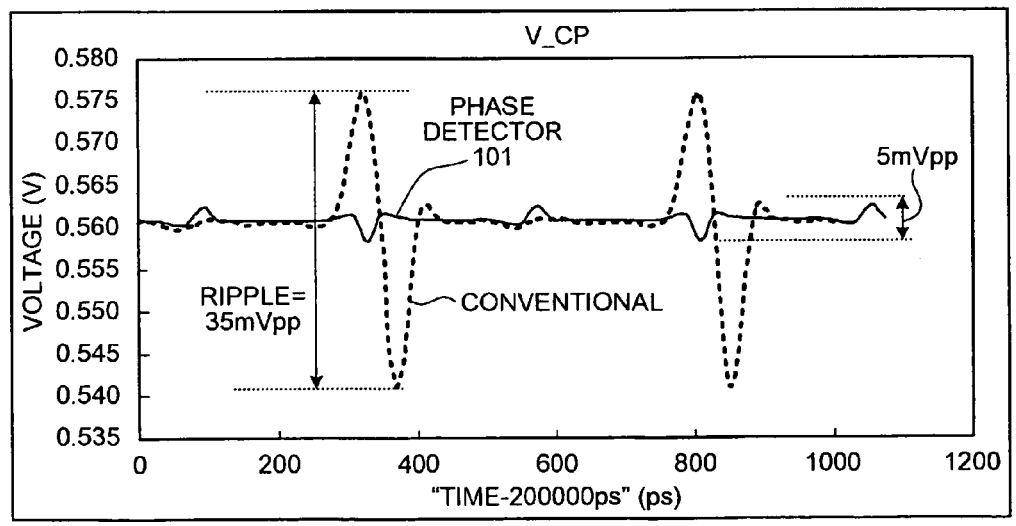
FIG. 8 is a timing diagram depicting a simulation result in the locked state of the CMU adopting the phase detection apparatus according to the exemplary embodiments.

FIG. 7 is a timing diagram depicting a simulation result immediately before the locked state of a CMU adopting a phase detection apparatus according to the exemplary embodiments. FIG. 7 depicts voltage V_CP output from the CP 1102 in a state before the locked state of a CMU (for example, see FIG. 15). Conditions of FIGS. 7 and 8 are Vdd=1.2V, a frequency of output clock Ck(f)=20 GHz, and a frequency of input clock fr=625 MHz. The CMU adopting the PD 101 of the exemplary embodiments suppresses the voltage V_CP output from the CP 1102 to 9 mVpp. In the case of a CMU including a conventional PD 1101, the maximum amplitude of the voltage V_CP output from the CP 1102 is 35 mVpp. The CMU adopting the PD 101 of the exemplary embodiments can reduce ripples to approximately a quarter of the conventional CMU. In addition, as a consequence of reduction of the amplitude of ripples, the time period during which the ripples occur is shortened. As can be seen from the figures, suppressed ripples save outputs to reduce power consumption of the entire circuit. The simulation parameters of the figures are based on typical transistor delay (parameters of a 90 nm standard CMOS) (cf. Berkeley Predictive Technology Model (BPTM) of the University of California, Berkeley).

FIG. 8 is a timing diagram depicting a simulation result in the locked state of the CMU adopting a phase detection apparatus according to the exemplary embodiments. FIG. 8 depicts the voltage V_CP output from the CP 1102 in the locked state of a CMU (for example, see FIG. 15). After approximately 200 nsec (approximately 500 cycles of the clock signal fr) from the activation, the state enters a locked state. With the CMU adopting the PD 101 of the exemplary embodiments, the maximum of the voltage V CP output from the CP 1102 is 5 mVpp and ripples are substantially reduced. Fluctuation is due to noise from the supply voltage Vdd and is small. Therefore, while electric current from the supply voltage Vdd is shut off, theoretically ripples can be reduced to zero. In the case of a CMU including the conventional PD 1101, the maximum amplitude of the voltage V_CP output from the CP 1102 is 35 mVpp and is large in comparison with the CMU of the exemplary embodiments.

Figure 9:
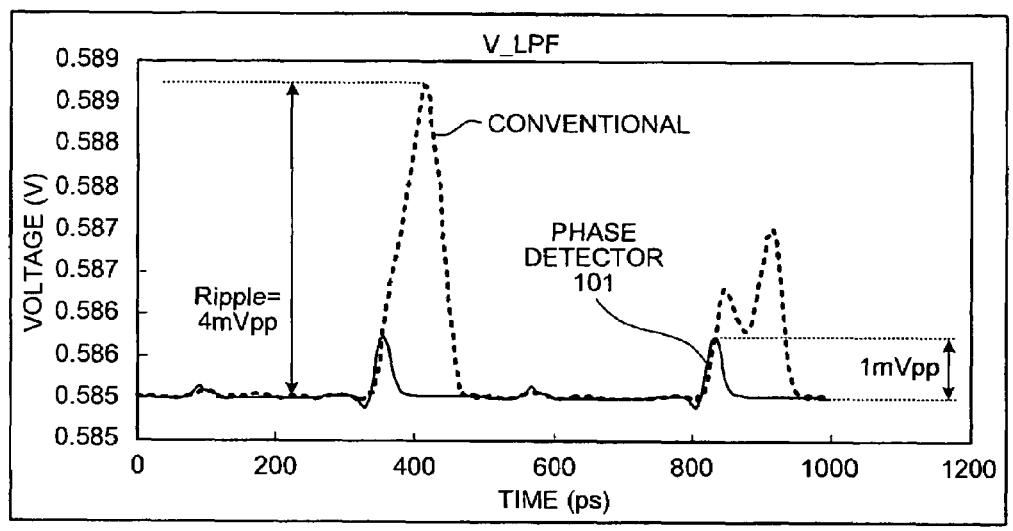
FIG. 9 is a timing diagram depicting a simulation result after the locked state of the CMU adopting the phase detection apparatus according to the exemplary embodiments.

FIG. 9 is a timing diagram depicting a simulation result after the locked state of the CMU adopting a phase detection apparatus according to the exemplary embodiments. After the locked state, random noise appears from a power supply source or other devices (SERDES 1001 in FIG. 14, VCO 1104 in FIG. 15 and so on). However, the PD 101 of the exemplary embodiments remains stable. The voltage V_LPF output from the LPF 1103 of the CMU adopting the PD 101 of the exemplary embodiments is 1 mVpp while the voltage V_LPF output from the LPF 1103 of the CMU including the conventional PD 1101 is 4 mVpp.

Figure 10:
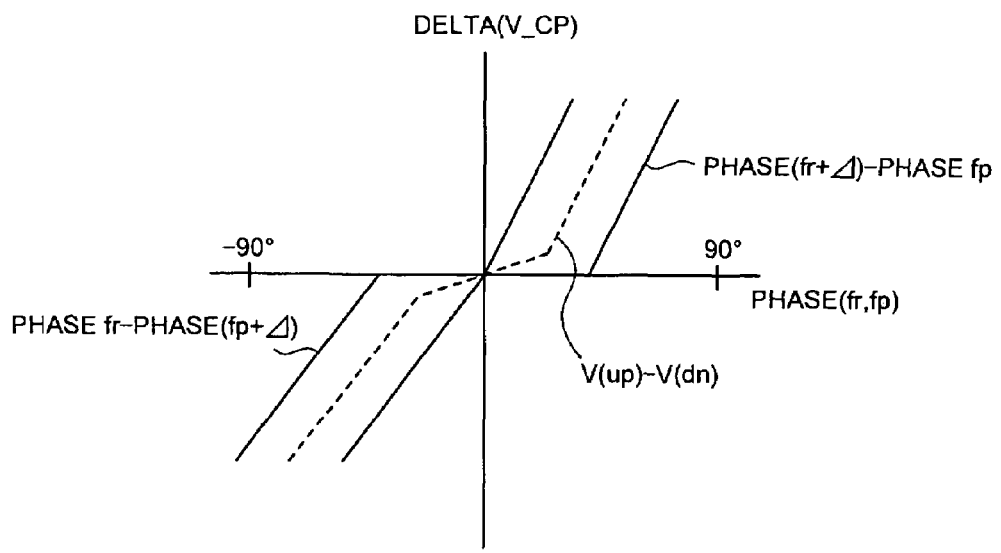
FIG. 10 is a graph depicting a phase detection region (ideal state) of the phase detection apparatus according to the exemplary embodiments.

FIG. 10 is a graph depicting a phase detection region (ideal state) of a phase detection apparatus according to the exemplary embodiments. The abscissa axis indicates the phase difference between the input clocks fr and fp. The ordinate axis indicates variation of the voltage V_CP (Delta(V_CP)). The two variable delay devices 1 and 2 (111 and 112) in the PD 101 induce a certain amount of delay to the clocks fr and fp. The variable delay device 1 (111) outputs phase fr−(fp+Δ), and the variable delay device 2 (112) outputs phase (fr+Δ)−fp, where Δ is a variable delay. A sum of the output from the two variable delay devices 1 and 2 (111 and 112) is, as indicated by the dotted line in the figure, V(up)−V(dn), a sum of the output from the logic gates 1 and 2 (1211 and 1212), where Delta(V_CP)=V(up)−V(dn). The input clocks fr and fp are delayed so that the dead zone of the logic gates 1 and 2 (1211 and 1212) can be prevented.

Figure 11A:
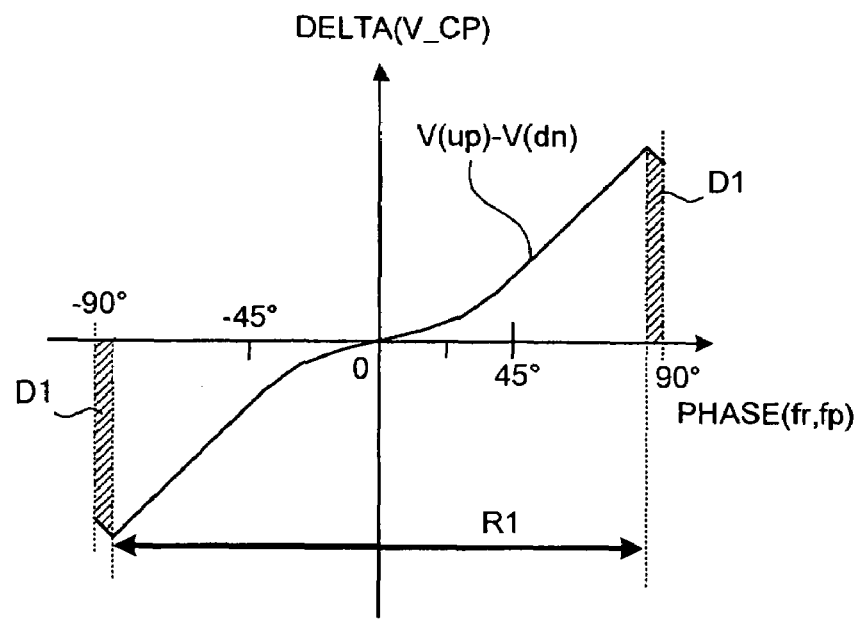
FIG. 11A is a graph depicting a phase detection range of the phase detection apparatus according to the exemplary embodiments.

FIG. 11A is a graph depicting a phase detection range of a phase detection apparatus according to the exemplary embodiments. The abscissa axis indicates the phase difference between the clocks fr and fp. The ordinate axis indicates variation of V_CP (Delta(V_CP)). Characteristics of the actual PD 101 are depicted in the figure. The PD 101 of the exemplary embodiments has a phase detection range R1 of approximately 180 degrees. A slight non-detected phase range D1, corresponding to the difference Δmin between delays fr2 and fp2 for inputs fr and fp at the locked state depicted in FIG. 3, occurs at both sides of R1; however, the dead zone does not affect operation.

Figure 11B:
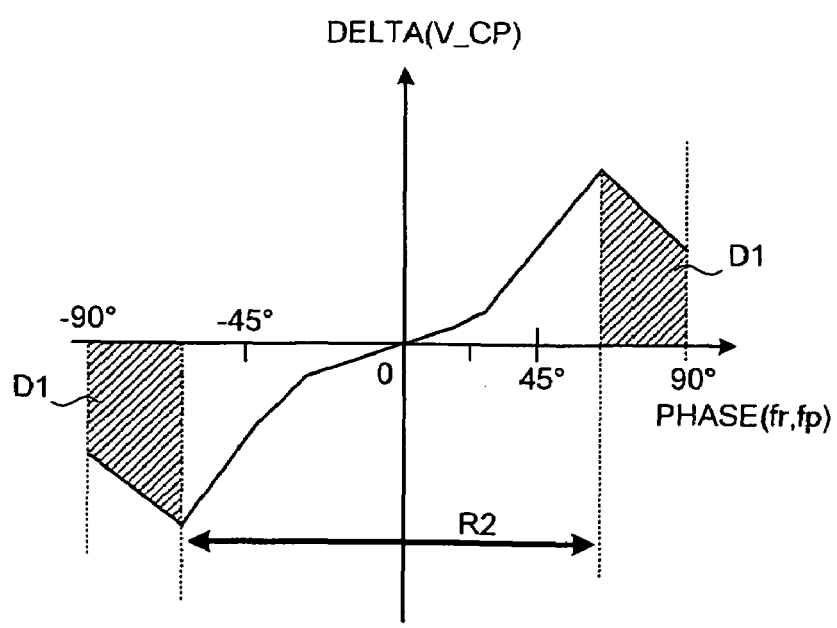
FIG. 11B is a graph depicting a phase detection range of a conventional phase detection apparatus.
Figure 17:
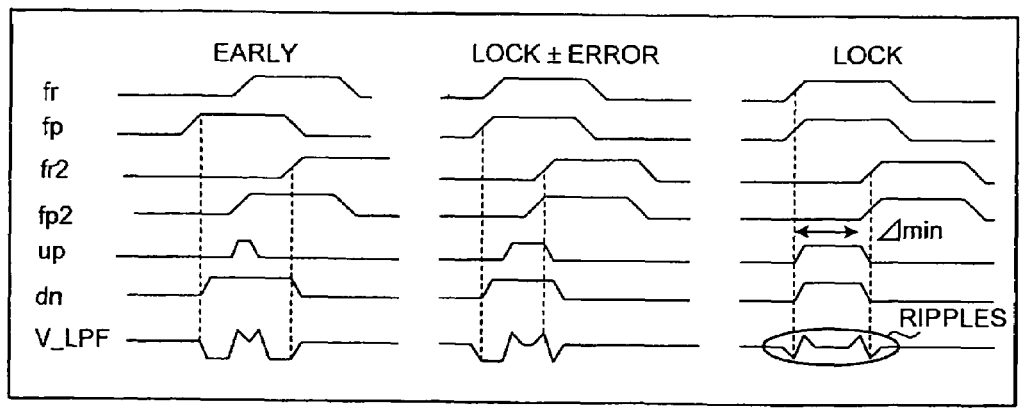
FIG. 17 is a timing chart depicting operation of a conventional phase-detecting unit.

FIG. 11B is a graph depicting a phase detection range of a conventional phase detection apparatus. Since in the conventional PD 1101 depicted in FIG. 16, the delay devices 1 and 2 (1201 and 1202) have a fixed delay, the output signals up and dn excessively overlap each other as depicted in FIG. 17. As a result, a phase detection range R2 is narrow. A non-detected phase range Dl at both sides of R2 is larger (compared to that for the PD 101) since the difference Δmin between the delays fr2 and fp2 for inputs fr and fp at the locked state depicted in FIG. 17 is a constant value, whereby the dead zone affects operation.

Figure 12:
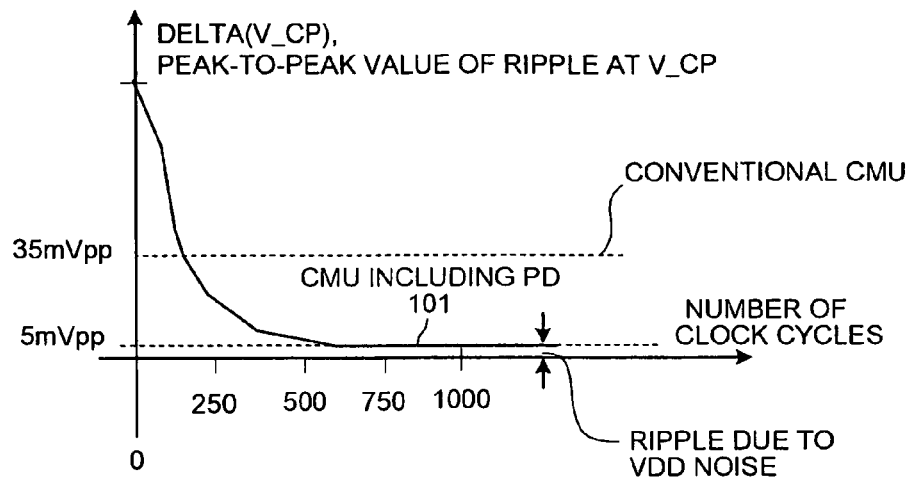
FIG. 12 is a timing diagram depicting transition of the magnitude of a ripple component.

FIG. 12 is a timing diagram depicting transition of the magnitude of a ripple component. The abscissa axis indicates time (clock cycle). The ordinate axis indicates a value of a ripple component in the voltage V_CP. The timing diagram depicts an example where the CMU adopting a phase detection apparatus of the exemplary embodiments is applied to a transmission apparatus of 40 Gbps. At the activation of the CMU, the ripple component of the voltage V_CP of the CP 1102 is large. However, as the time passes, the value of the ripple component quickly decreases. Around 500 cycles, the ripple component converges to 5 mVpp, a value removing the influence of ripples, and the value is maintained. On the other hand, in the case of the CMU 1010 including the conventional PD 1101, the ripple component does not become lower than 35 mVpp.

As set forth above, according to a phase detection apparatus adopting a phase detection unit of the exemplary embodiments:

(1) Until a CMU shifts to a locked state, transient ripples are reduced. At the locked state, no ripples occur;

(2) With CMOS and BiCMOS, the phase detection apparatus is applied to a transmission apparatus operating at a frequency higher than 20 GHz;
(3) Jitter in the output of the CMU is reduced and noise is reduced;
(4) Since identical variable delay devices and logic blocks are used in the phase-difference detection unit and the feedback circuit of the phase detection unit, the influence of a temperature change and fabrication process variation of devices is eliminated;
(5) The phase detection unit includes the phase-difference detection unit through which the clock signals pass, and the feedback circuit that controls the phase-difference detection unit based on a configuration and an input similar to the phase-difference detection unit. The feedback circuit outputs a control signal Vcontrol to the phase-difference detection unit and controls a delay at the phase-difference detection unit to output signals up and dn of an appropriate pulse width, whereby power consumption is reduced;
(6) The phase detection unit, which is arranged in an LSI, has fewer devices, is simple and small in size, whereby the dead zone is eliminated and power consumption is reduced;
(7) The phase detection apparatus, in which high-speed clock operation is possible, can be applied with a CMOS to a transmission apparatus of a high data transmission rate such as 40 Gbps or to a small-size mobile terminal; and
(8) The phase detection range of the phase-difference detection unit is expanded nearly to the limit of 180 degrees, whereby the dead zone is substantially eliminated.

Figure 14:
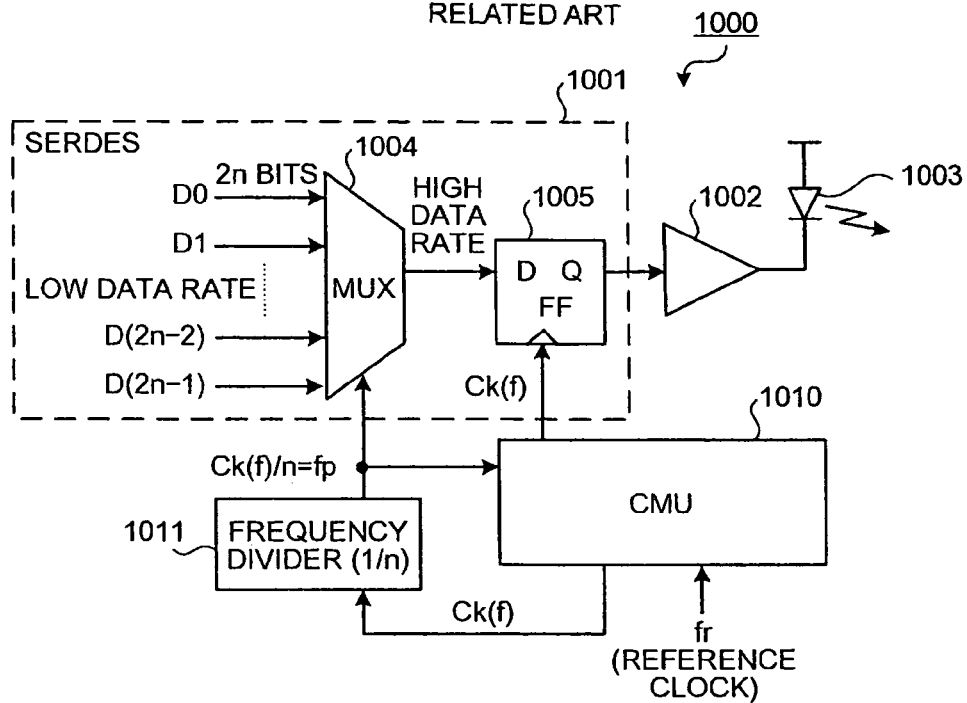
FIG. 14 is a circuit diagram of a conventional transmission apparatus.

An output of the CMU adopting a phase detection unit of the exemplary embodiments is not limited to SERDES 1001 depicted in FIG. 14. Further, the output Ck(f) of the VCO of the CMU may be output to a clock generator.

Figure 13A:
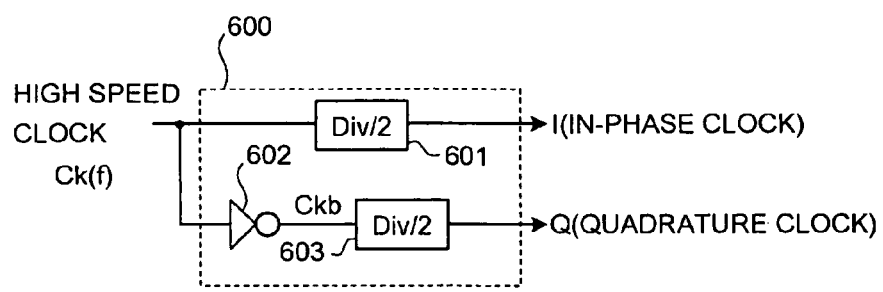
FIG. 13A is a diagram depicting a clock generator.

FIG. 13A is a diagram depicting a clock generator. A clock generator 600 splits the clock Ck(f) and inputs the clock Ck(f) into a frequency divider (Div/2) 601 and via an inverter 602, to a frequency divider (Div/2) 603. The frequency divider 601 outputs an I (in-phase) clock and the frequency divider 603 outputs a Q (quadrature) clock.

Figure 13B:
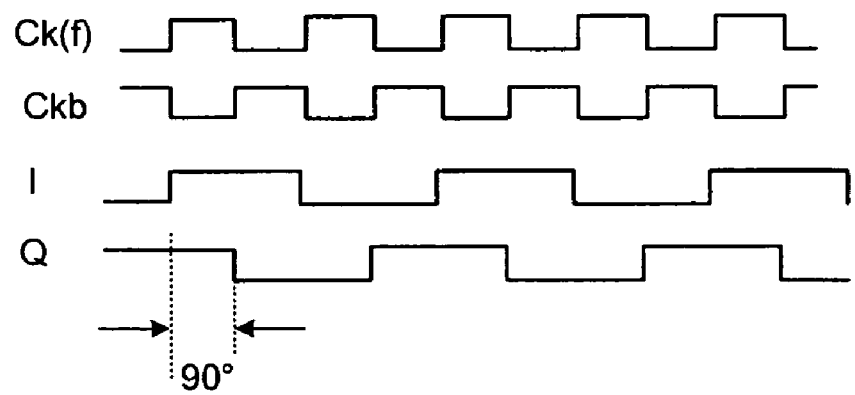
FIG. 13B is a timing chart of the clock generator depicted in FIG. 13A.

FIG. 13B is a timing chart of the clock generator depicted in FIG. 13A. The frequency divider 601 reduces the clock Ck(f) in half and outputs the clock Ck(f) as the I clock. The inverter 602 inverts the clock Ck(f) to output a clock Ckb and the frequency divider 603 reduces the clock Ckb in half to output the Q clock. The phase difference between the I clock and the Q clock is 90 degrees.

Figure 13C:
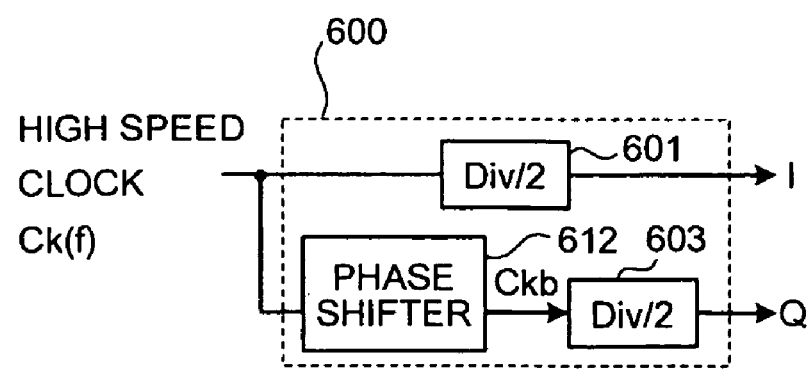
FIG. 13C is a diagram depicting another example of the clock generator.

FIG. 13C is a diagram depicting another example of the clock generator. A phase shifter 612 is used in place of the inverter 602. The phase shifter 612 may be a delay device or a phase interpolator.

The clock generator 600 depicted in FIGS. 13A and 13C is widely used in wireless and wire communications. The clock generator 600 outputs clocks for the two phases I and Q, which are input to a PLL circuit, a data processing apparatus, a data re-timer (synchronizer or clock data recovery (CDR), etc.

The PD 101 may be mounted on an integrated circuit such as an LSI. The PD 101 may be formed by more than two devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A phase detection apparatus comprising:
a phase-difference detection unit that includes:
a first variable delay device that delays a phase of a first clock by a variable amount,
a first logic gate that detects a phase difference between the first clock delayed by the first variable delay device and a second clock, and outputs a first signal of a pulse width corresponding to the phase difference detected,
a second variable delay device that delays a phase of the second clock by a variable amount, and
a second logic gate that detects a phase difference between the second clock delayed by the second variable delay device and the first clock, and outputs a second signal of a pulse width corresponding to the phase difference detected; and
a feedback circuit that includes:
a third variable delay device that delays the phase of the first clock by a variable amount,
a third logic gate that detects a phase difference between the first clock delayed by the third variable delay device and the first clock, and outputs a third signal of a pulse width corresponding to the phase difference detected, and
a smoothing unit that outputs an integral of the pulse width of the third signal as a control signal indicative of an amount of delay, the control signal being fed back to the third variable delay device and input to the first and the second variable delay devices, wherein
the feedback circuit is arranged independent of the phase-difference detection unit.

2. The phase detection apparatus according to claim 1, wherein the amount of delay of the first variable delay device, the second variable delay device, and the third variable delay device is gradually reduced from initiation of operation in response to the control signal.

3. The phase detection apparatus according to claim 1, wherein devices included in the phase-difference detection unit and the feedback circuits are arranged in a given region of a single IC.

4. The phase detection apparatus according to claim 1, wherein the first, the second, and the third variable delay devices each include a resistor of a fixed resistance and a variable capacitor having a capacitance that varies according to the control signal.

5. The phase detection apparatus according to claim 1, wherein the first, the second, and the third variable delay devices each include a capacitor having a fixed capacitance and a variable resistor having a resistance that varies according to the control signal.

6. The phase detection apparatus according to claim 1, wherein the first, the second, and the third variable delay devices include a p-type MOSFET, an n-type MOSFET, and a variable resistor having a resistance that varies according to the control signal.

7. The phase detection apparatus according to claim 1, wherein when a frequency of the second clock is substantially equal to a frequency of the first clock, the second clock is input to the feedback circuit.

8. A phase synchronization apparatus comprising:
a phase-difference detection unit that includes:
a first variable delay device that delays a phase of a first clock by a variable amount,
a first logic gate that detects a phase difference between the first clock delayed by the first variable delay device and a second clock, and outputs a first signal of a pulse width corresponding to the phase difference detected, a second variable delay device that delays a phase of the second clock by a variable amount, and a second logic gate that detects a phase difference between the second clock delayed by the second variable delay device and the first clock, and outputs a second signal of a pulse width corresponding to the phase difference detected;

a feedback circuit that includes:

a third variable delay device that delays the phase of the first clock by a variable amount, a third logic gate that detects a phase difference between the first clock delayed by the third variable delay device and the first clock, and outputs a third signal of a pulse width corresponding to the phase difference detected, and a first smoothing unit that outputs an integral of the pulse width of the third signal as a control signal indicative of an amount of delay, the control signal being fed back to the third variable delay device and input to the first and the second variable delay devices;

a charge pump that outputs a signal of a value corresponding to the first signal and the second signal;

a second smoothing unit that outputs a signal of a value obtained by smoothing the signal from the charge pump; and an oscillator that changes an oscillating frequency based on the signal from the second smoothing unit and outputs the first clock, wherein the feedback circuit is arranged independent of the phase-difference detection unit.

9. The phase synchronization apparatus according to claim 8, further comprising a frequency divider that scales a frequency of a signal from the oscillator by a given factor, wherein a signal from the frequency divider is input to the phase-difference detection unit as the first clock.

10. The phase synchronization apparatus according to claim 8, wherein when a frequency of the second clock is substantially equal to a frequency of the first clock, the second clock is input to the feedback circuit.

* * * * *

UNITED STATES PATENT AND TRADEMARK OFFICE
CERTIFICATE OF CORRECTION

PATENT NO.         : 7,675,328 B2                                              Page 1 of 1
APPLICATION NO.    : 12/320494
DATED              : March 9, 2010
INVENTOR(S)        : Tszshing Cheung It is certified that error appears in the above-identified patent and that said Letters Patent is hereby corrected as shown below:

On the title page, item [57], Column 2 (Abstract), Line 9, after "back" insert --to--.

Signed and Sealed this

Eighteenth Day of May, 2010

David J. Kappos
*Director of the United States Patent and Trademark Office*